United States Patent
Qian et al.

(10) Patent No.: US 6,714,606 B1
(45) Date of Patent: Mar. 30, 2004

(54) INTEGRATED SERVICES DIGITAL BROADCASTING DEINTERLEAVER ARCHITECTURE

(75) Inventors: Cheng Qian, San Jose, CA (US); Advait Mogre, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/477,317

(22) Filed: Jan. 4, 2000

(51) Int. Cl.$^7$ .............................................. H04L 27/06
(52) U.S. Cl. ...................................................... 375/341
(58) Field of Search ................................ 375/341, 340, 375/316; 714/752, 751, 784, 701

(56) References Cited

U.S. PATENT DOCUMENTS 5,822,008 A * 10/1998 Inoue et al. ................ 348/446
6,353,900 B1 * 3/2002 Sindhushayana et al. ... 714/701
6,480,976 B1 * 11/2002 Pan et al. .................... 714/701

\* cited by examiner

*Primary Examiner*—Khai Tran
(74) *Attorney, Agent, or Firm*—Christopher P. Maiorana, PC

(57) ABSTRACT

An apparatus comprising a memory, a write pointer, a read pointer and a control circuit. The memory may have a plurality of memory locations accessed by a plurality of addresses. The write pointer may be configured to write data to the memory in response to a sequence of write addresses generated in response to a first control signal. The read pointer may be configured to read data from the memory in response to a sequence of read addresses generated in response to a second control signal. The control circuit may be configured to generate (i) the first control signal, and (ii) the second control signal. The order data is read from said memory may comprise a de-interleaved pattern with respect to the order the data is written to the memory.

20 Claims, 9 Drawing Sheets

| ROUND ---- 0 | | | | | | | WRITE |
|---|---|---|---|---|---|---|---|
| 0 ( 0) | 11 ( 1) | 22 ( 2) | 33 ( 3) | 44 ( 4) | 55 ( 5) | 66 ( 6) | 77 ( 7) |
| 1 ( 8) | 12 ( 9) | 23 (10) | 34 (11) | 45 (12) | 56 (13) | 67 (14) | 78 (15) |
| 2 (16) | 13 (17) | 24 (18) | 35 (19) | 46 (20) | 57 (21) | 68 (22) | 79 (23) |
| 3 (24) | 14 (25) | 25 (26) | 36 (27) | 47 (28) | 58 (29) | 69 (30) | 80 (31) |
| 4 (32) | 15 (33) | 26 (34) | 37 (35) | 48 (36) | 59 (37) | 70 (38) | 81 (39) |
| 5 (40) | 16 (41) | 27 (42) | 38 (43) | 49 (44) | 60 (45) | 71 (46) | 82 (47) |
| 6 (48) | 17 (49) | 28 (50) | 39 (51) | 50 (52) | 61 (53) | 72 (54) | 83 (55) |
| 7 (56) | 18 (57) | 29 (58) | 40 (59) | 51 (60) | 62 (61) | 73 (62) | 84 (63) |
| 8 (64) | 19 (65) | 30 (66) | 41 (67) | 52 (68) | 63 (69) | 74 (70) | 85 (71) |
| 9 (72) | 20 (73) | 31 (74) | 42 (75) | 53 (76) | 64 (77) | 75 (78) | 86 (79) |
| 10 (80) | 21 (81) | 32 (82) | 43 (83) | 54 (84) | 65 (85) | 76 (86) | 87 (87) |

READ

FIG. 3

| ROUND - - - 0 | | | | | | | | |
|---|---|---|---|---|---|---|---|---|
| 0 ( 0) | 11 ( 1) | 22 ( 2) | 33 ( 3) | 44 ( 4) | 55 ( 5) | 66 ( 6) | 77 ( 7) | |
| 11 ( 8) | 12 ( 9) | 23 (10) | 34 (11) | 45 (12) | 56 (13) | 67 (14) | 78 (15) | |
| 22 (16) | 13 (17) | 24 (18) | 35 (19) | 46 (20) | 57 (21) | 68 (22) | 79 (23) | |
| 33 (24) | 14 (25) | 25 (26) | 36 (27) | 47 (28) | 58 (29) | 69 (30) | 80 (31) | |
| 44 (32) | 15 (33) | 26 (34) | 37 (35) | 48 (36) | 59 (37) | 70 (38) | 81 (39) | |
| 55 (40) | 16 (41) | 27 (42) | 38 (43) | 49 (44) | 60 (45) | 71 (46) | 82 (47) | |
| 66 (48) | 17 (49) | 28 (50) | 39 (51) | 50 (52) | 61 (53) | 72 (54) | 83 (55) | |
| 77 (56) | 18 (57) | 29 (58) | 40 (59) | 51 (60) | 62 (61) | 73 (62) | 84 (63) | |
| 1 (64) | 19 (65) | 30 (66) | 41 (67) | 52 (68) | 63 (69) | 74 (70) | 85 (71) | |
| 12 (72) | 20 (73) | 31 (74) | 42 (75) | 53 (76) | 64 (77) | 75 (78) | 86 (79) | |
| 23 (80) | 21 (81) | 32 (82) | 43 (83) | 54 (84) | 65 (85) | 76 (86) | 87 (87) | |
| WRITE → | READ → | | | | | | | |

FIG. 5

ROUND --- 1

| 0 ( 0) | 11 ( 88) | 22 (16) | 33 (24) | 44 (32) | 55 (40) | 66 (48) | 77 (56) |
|---|---|---|---|---|---|---|---|
| 1 (64) | 12 (72) | 23 (80) | 34 ( 1) | 45 ( 9) | 56 (17) | 67 (25) | 78 (33) |
| 2 (41) | 13 (49) | 24 (57) | 35 (65) | 46 (73) | 57 (81) | 68 ( 2) | 79 (10) |
| 3 (18) | 14 (26) | 25 (34) | 36 (42) | 47 (50) | 58 (58) | 69 (66) | 80 (74) |
| 4 (82) | 15 ( 3) | 26 (11) | 37 (19) | 48 (27) | 59 (35) | 70 (43) | 81 (51) |
| 5 (59) | 16 (67) | 27 (75) | 38 (83) | 49 ( 4) | 60 (12) | 71 (20) | 82 (28) |
| 6 (36) | 17 (44) | 28 (52) | 39 (60) | 50 (68) | 61 (76) | 72 (84) | 83 ( 5) |
| 7 (13) | 18 (21) | 29 (29) | 40 (37) | 51 (45) | 52 (53) | 73 (61) | 84 (69) |
| 8 (77) | 19 (85) | 30 ( 6) | 41 (14) | 52 (22) | 63 (30) | 74 (38) | 85 (46) |
| 9 (54) | 20 (62) | 31 (70) | 42 (78) | 53 (86) | 64 ( 7) | 75 (15) | 86 (23) |
| 10 (31) | 21 (39) | 32 (47) | 43 (55) | 54 (63) | 65 (71) | 76 (79) | 87 (87) |

ROUND --- 2

| 0 ( 0) | 11 ( 64) | 22 (41) | 33 (18) | 44 (82) | 55 (59) | 66 (36) | 77 (13) |
|---|---|---|---|---|---|---|---|
| 1 (77) | 12 (54) | 23 (31) | 34 ( 8) | 45 (72) | 56 (49) | 67 (26) | 78 ( 3) |
| 2 (67) | 13 (44) | 24 (21) | 35 (85) | 46 (62) | 57 (39) | 68 (16) | 79 (80) |
| 3 (57) | 14 (34) | 25 (11) | 36 (75) | 47 (52) | 58 (29) | 69 ( 6) | 80 (70) |
| 4 (47) | 15 (24) | 26 ( 1) | 37 (65) | 48 (42) | 59 (19) | 70 (83) | 81 (60) |
| 5 (37) | 16 (14) | 27 (78) | 38 (55) | 49 (32) | 60 ( 9) | 71 (73) | 82 (50) |
| 6 (27) | 17 ( 4) | 28 (68) | 39 (45) | 50 (22) | 61 (86) | 72 (63) | 83 (40) |
| 7 (14) | 18 (81) | 29 (58) | 40 (35) | 51 (12) | 52 (76) | 73 (53) | 84 (30) |
| 8 ( 7) | 19 (71) | 30 (48) | 41 (25) | 52 ( 2) | 63 (66) | 74 (43) | 85 (20) |
| 9 (84) | 20 (61) | 31 (38) | 42 (15) | 53 (79) | 64 (56) | 75 (33) | 86 (10) |
| 10 (74) | 21 (51) | 32 (28) | 43 ( 5) | 54 (69) | 65 (46) | 76 (23) | 87 (87) |

ROUND --- 3

| 0 ( 0) | 11 ( 77) | 22 (67) | 33 (57) | 44 (47) | 55 (37) | 66 (27) | 77 (17) |
|---|---|---|---|---|---|---|---|
| 1 ( 7) | 12 (84) | 23 (74) | 34 (64) | 45 (54) | 56 (44) | 67 (34) | 78 (24) |
| 2 (14) | 13 ( 4) | 24 (81) | 35 (71) | 46 (61) | 57 (51) | 68 (41) | 79 (31) |
| 3 (21) | 14 (11) | 25 ( 1) | 36 (78) | 47 (68) | 58 (58) | 69 (48) | 80 (38) |
| 4 (28) | 15 (18) | 26 ( 8) | 37 (85) | 48 (75) | 59 (65) | 70 (55) | 81 (45) |
| 5 (35) | 16 (25) | 27 (15) | 38 ( 5) | 49 (82) | 60 (72) | 71 (62) | 82 (52) |
| 6 (42) | 17 (32) | 28 (29) | 39 (12) | 50 ( 2) | 61 (79) | 72 (69) | 83 (59) |
| 7 (49) | 18 (36) | 29 (36) | 40 (19) | 51 ( 9) | 52 (86) | 73 (76) | 84 (66) |
| 8 (56) | 19 (46) | 30 (43) | 41 (26) | 52 (16) | 63 ( 6) | 74 (83) | 85 (73) |
| 9 (63) | 20 (53) | 31 (50) | 42 (33) | 53 (23) | 64 (13) | 75 ( 3) | 86 (80) |
| 10 (70) | 21 (60) | 32 (28) | 43 (40) | 54 (30) | 65 (20) | 76 (10) | 87 (87) |

ROUND --- 4

| 0 ( 0) | 11 ( 7) | 22 (14) | 33 (21) | 44 (28) | 55 (35) | 66 (42) | 77 (49) |
|---|---|---|---|---|---|---|---|
| 1 (56) | 12 (63) | 23 (70) | 34 (77) | 45 (84) | 56 ( 4) | 67 (11) | 78 (18) |
| 2 (25) | 13 (32) | 24 (39) | 35 (46) | 46 (53) | 57 (60) | 68 (67) | 79 (74) |
| 3 (81) | 14 ( 1) | 25 ( 8) | 36 (15) | 47 (22) | 58 (29) | 69 (36) | 80 (43) |
| 4 (50) | 15 (57) | 26 (64) | 37 (71) | 48 (78) | 59 (85) | 70 ( 5) | 81 (12) |
| 5 (19) | 16 (26) | 27 (33) | 38 (40) | 49 (47) | 60 (54) | 71 (61) | 82 (68) |
| 6 (75) | 17 (82) | 28 ( 2) | 39 ( 9) | 50 (16) | 61 (23) | 72 (30) | 83 (37) |
| 7 (44) | 18 (51) | 29 (58) | 40 (65) | 51 (72) | 52 (79) | 73 (86) | 84 ( 6) |
| 8 (13) | 19 (20) | 30 (27) | 41 (34) | 52 (41) | 63 (48) | 74 (55) | 85 (62) |
| 9 (69) | 20 (76) | 31 (83) | 42 ( 3) | 53 (10) | 64 (17) | 75 (24) | 86 (31) |
| 10 (38) | 21 (45) | 32 (52) | 43 (59) | 54 (66) | 65 (73) | 76 (80) | 87 (87) |

FIG. 6

| | | | | | | | |
|---|---|---|---|---|---|---|---|
| 0 ( 0) | 11 ( 1) | 22 ( 2) | 33 ( 3) | 44 ( 4) | 55 ( 5) | 66 ( 6) | 77 ( 7) |
| 1 ( 8) | 12 ( 9) | 23 (10) | 34 (11) | 45 (12) | 56 (13) | 67 (14) | 78 (15) |
| 2 (16) | 13 (17) | 24 (18) | 35 (19) | 46 (20) | 57 (21) | 68 (22) | 79 (23) |
| 3 (24) | 14 (25) | 25 (26) | 36 (27) | 47 (28) | 58 (29) | 69 (30) | 80 (31) |
| 4 (32) | 15 (33) | 26 (34) | 37 (35) | 48 (36) | 59 (37) | 70 (38) | 81 (39) |
| 5 (40) | 16 (41) | 27 (42) | 38 (43) | 49 (44) | 60 (45) | 71 (46) | 82 (47) |
| 6 (48) | 17 (49) | 28 (50) | 39 (51) | 50 (52) | 61 (53) | 72 (54) | 83 (55) |
| 7 (56) | 18 (57) | 29 (58) | 40 (59) | 51 (60) | 52 (61) | 73 (62) | 84 (63) |
| 8 (64) | 19 (65) | 30 (66) | 41 (67) | 52 (68) | 63 (69) | 74 (70) | 85 (71) |
| 9 (72) | 20 (73) | 31 (74) | 42 (75) | 53 (76) | 64 (77) | 75 (78) | 86 (79) |
| 10 (80) | 21 (81) | 32 (82) | 43 (83) | 54 (84) | 65 (85) | 76 (86) | 87 (87) |
| D (88) | D (89) | D (90) | D (91) | D (92) | D (93) | D (94) | D (95) |
| D (96) | D (97) | D (98) | D (99) | D(100) | D(101) | D(102) | D(103) |
| D(104) | D(105) | D(106) | D(107) | D(108) | D(109) | D(110) | D(111) |
| D(112) | D(113) | D(114) | D(115) | D(116) | D(117) | D(118) | D(119) |
| D(120) | D(121) | D(122) | D(123) | D(124) | D(125) | D(126) | D(127) |

DUMMIES

FIG. 9

| 0 ( 0)   | 2 ( 1)   | 4 ( 2)   | 6 ( 3)   | 8 ( 4)   | 10 ( 5)  | D ( 6)   | D ( 7)   |
|----------|----------|----------|----------|----------|----------|----------|----------|
| 1 ( 8)   | 3 ( 9)   | 5 (10)   | 7 (11)   | 9 (12)   | D (13)   | D (14)   | D (15)   |
| 11 (16)  | 13 (17)  | 15 (18)  | 17 (19)  | 19 (20)  | 21 (21)  | D (22)   | D (23)   |
| 12 (24)  | 14 (25)  | 16 (26)  | 18 (27)  | 20 (28)  | D (29)   | D (30)   | D (31)   |
| 22 (32)  | 24 (33)  | 26 (34)  | 28 (35)  | 30 (36)  | 32 (37)  | D (38)   | D (39)   |
| 23 (40)  | 25 (41)  | 27 (42)  | 29 (43)  | 31 (44)  | D (45)   | D (46)   | D (47)   |
| 33 (48)  | 35 (49)  | 37 (50)  | 39 (51)  | 41 (52)  | 43 (53)  | D (54)   | D (55)   |
| 34 (56)  | 36 (57)  | 38 (58)  | 40 (59)  | 42 (60)  | D (61)   | D (62)   | D (63)   |
| 44 (64)  | 46 (65)  | 48 (66)  | 50 (67)  | 52 (68)  | 54 (69)  | D (70)   | D (71)   |
| 45 (72)  | 47 (73)  | 49 (74)  | 51 (75)  | 53 (76)  | D (77)   | D (78)   | D (79)   |
| 55 (80)  | 57 (81)  | 59 (82)  | 61 (83)  | 63 (84)  | 65 (85)  | D (86)   | D (87)   |
| 56 (88)  | 58 (89)  | 60 (90)  | 62 (91)  | 64 (92)  | D (93)   | D (94)   | D (95)   |
| 66 (96)  | 68 (97)  | 70 (98)  | 72 (99)  | 74 (100) | 76 (101) | D (102)  | D (103)  |
| 67 (104) | 69 (105) | 71 (106) | 73 (107) | 75 (108) | D (109)  | D (110)  | D (111)  |
| 77 (112) | 79 (113) | 81 (114) | 83 (115) | 85 (116) | 87 (117) | D (118)  | D (119)  |
| 78 (120) | 80 (121) | 82 (122) | 84 (123) | 86 (124) | D (125)  | D (126)  | D (127)  |

FIG. 10

INTEGRATED SERVICES DIGITAL BROADCASTING DEINTERLEAVER ARCHITECTURE

FIELD OF THE INVENTION

The present invention relates to memory buffers generally and, more particularly, to an integrated services digital broadcasting (ISDB) de-interleaver architecture.

BACKGROUND OF THE INVENTION

The Japanese integrated services digital broadcasting (ISDB) standard uses a 203×8 block interleaver before a convolution encoder and after an RS encoder and randomizer. Data bytes are transmitted in the format of 203 bytes/slot, 48 slots/frame, 8 frames/ super frame. The interleaver operates on the n-th slot of every frame in one super frame, where n=0, 1, 2, . . . , 47. Upon receipt, the data bytes must be de-interleaved.

Referring to FIG. 1, a block diagram of a conventional block de-interleaver 10 is shown. The block de-interleaver 10 is used to de-interleave super frames in the Japanese integrated services digital broadcasting (ISDB) standard. The block de-interleaver 10 requires two super frame memories 12 and 14 to de-interleave a received signal. The block de-interleaver 10 writes data from the received signal into one super frame memory 12 while presenting data of a previously received signal from the other super frame memory 14. When one super frame of data is finished, the reading and writing exchange memory frames.

In the example of the Japanese ISDB standard, the super frame memory size is 76.125K bytes. The need for two super frame memories doubles the memory used to implement the device. Doubling the memory on a chip increases the cost and decreases the chip yield. A solution is needed that will use less memory to de-interleaved a super frame.

SUMMARY OF THE INVENTION

The present invention concerns an apparatus comprising a memory, a write pointer, a read pointer and a control circuit. The memory may have a plurality of memory locations accessed by a plurality of addresses. The write pointer may be configured to write data to the memory in response to a sequence of write addresses generated in response to a first control signal. The read pointer may be configured to read data from the memory in response to a sequence of read addresses generated in response to a second control signal. The control circuit may be configured to generate (i) the first control signal, and (ii) the second control signal. The order data is read from said memory may comprise a de-interleaved pattern with respect to the order the data is written to the memory.

The objects, features and advantages of the present invention include providing an integrated services digital broadcasting de-interleaver architecture with slightly more than one super frame of memory that may de-interleave a Japanese ISDB standard super frame at a lower cost and/or higher chip yield.

BRIEF DESCRIPTION OF THE DRAWINGS

These and other objects, features and advantages of the present invention will be apparent from the following detailed description and the appended claims and drawings in which:

FIG. 3 is a diagram illustrating a first round write and read cycle of FIG. 2;

FIG. 5 is a diagram illustrating a write operation of a second super frame of data to the super frame memory of FIG. 2;

FIG. 6 is a diagram illustrating data stored after rounds 1–5;

FIG. 9 is a diagram illustrating an additional memory space for simplify ng the second write cycle; and FIG. 10 is a diagram illustrating the grouping of output data according to output frame in the enlarged memory of FIG. 7.

DETAILED DESCRIPTION OF THE PREFERRED EMBODIMENTS

Figure 1:
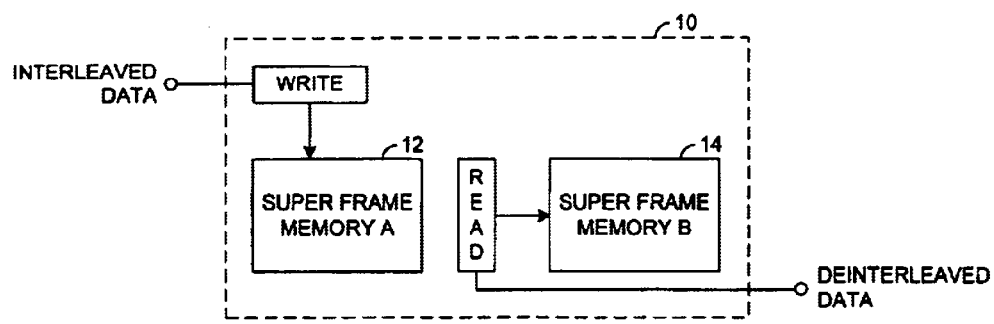
FIG. 1 is a block diagram illustrating a conventional block de-interleaver.
Figure 2:
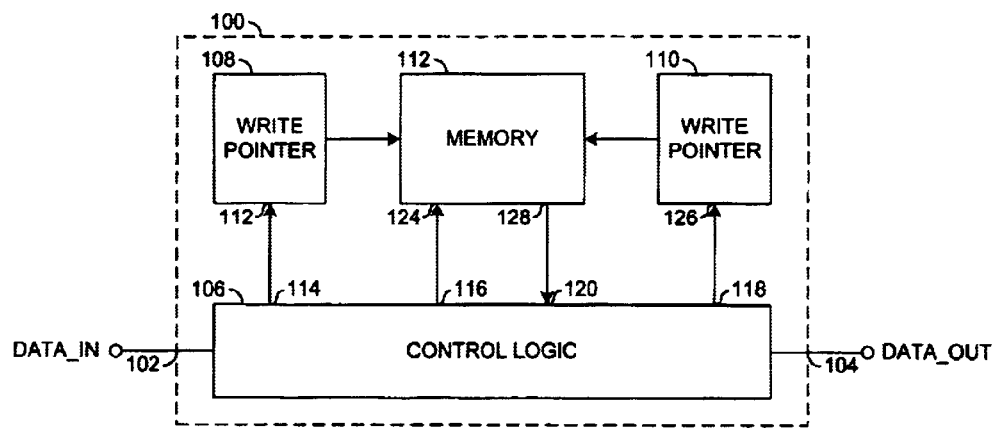
FIG. 2 is a block diagram of a circuit 100 illustrating a preferred embodiment of the present invention.

Referring to FIG. 2, a block diagram of a circuit 100 is shown in accordance with a preferred embodiment of the present invention. The circuit 100 may be implemented, in one example, as a Japanese integrated services digital broadcast (ISDB) standard block de-interleaver. The circuit 100 may be configured, in one example, to (i) receive an interleaved data signal (e.g., DATA_IN) at an input 102 and (ii) present a de-interleaved data signal (e.g., DATA_OUT) at an output 104. The signal DATA_IN and the signal DATA_OUT may be, in one example, Japanese ISDB standard super frames.

The circuit 100 may comprise a control circuit 106, a write pointer 108, a read pointer 110, and a memory 112. The control circuit 106 may have an output 114, an output 116, an output 118, and an input 120. The control circuit 106 may be configured to generate (i) a first control signal at the output 114 that may be presented to an input 122 of the write pointer 108, (ii) a data signal at the output 116 that may be presented to an input 124 of the memory 112, and (iii) a second control signal at the output 118 that may be presented to an input 126 of the read pointer 110. The input 120 may be configured to receive a data signal from an output 128 of the memory 112 that may be presented to the output 104.

The signal DATA_IN is generally presented to the control circuit 106. The control circuit 106 generally writes data bytes of the signal DATA_IN to address locations of the memory 112. The address locations are generally determined by the write pointer 108. The write pointer 108 may present a sequence of write addresses to the memory 112.

The read pointer 110 may present a sequence of read addresses to the memory 112 in response to the control signal received at the input 126.

The memory 112 may present data from the addresses to an input 120 of the control circuit 106. In one example, the control circuit 106 may be configured to generate the signal DATA_OUT in response to the data received from the memory 112. In another example (not shown), the memory 112 may present the signal DATA_OUT directly to the output 104.

When the control circuit 106 is writing the data of a first super frame, the read pointer 110 will generally not start reading data until the write pointer 108 has written a predetermined number of bytes. The initial delay of the read pointer may be defined as an operation window for the circuit 100 (to be described in more detail in connection with FIG. 4). To perform the desired de-interleaving function, the data stored in the memory 112 is generally read in a different order than the data was written.

The control circuit 102 generally calculates the addresses for reading and writing data according to predetermined mathematical formulas. The mathematical formulas are generally determined so that the order in which the data is written to the memory 112 combines with the order in which the stored data is read from the memory 112 to de-interleave the data.

The memory 112 may be, in one example, slightly larger than one conventional super frame memory. The memory 112 may be divided into a number of sections that generally correspond to the number of slots per frame of the signal DATA_IN. Each of the sections may be treated as an I×N array, where I is generally the number of frames and N is generally the number of bytes per slot in the signal DATA_IN. In one example, where DATA_IN is a Japanese integrated services digital broadcast standard super frame, the memory 112 may be divided into 48 sections, where each section is treated as an 8×203 byte array. The memory 112 may be implemented in one example as a Random Access Memory (RAM), a Static RAM (SRAM), a flash memory, or any other memory needed to meet the design criteria of a particular implementation.

The following example may illustrate the operation of the memory 112 for the i-th data byte received by the circuit 100:

$$\text{frame}=i/(N{\times}L)=i/(203{\times}48)=i/9744$$

$$\text{slot}=i\%(N{\times}L)/N=i\%(203{\times}48)/203=i\%9744/203$$

$$\text{index}=i\%(N{\times}L)\%N=i\%(203{\times}48)\%(203)=i\%(9744)\%(203)=i\%(203)$$

$$\text{pos}=(\text{frame}{\times}N)+\text{index}=(\text{frame}{\times}203)+\text{index}=i/9744{\times}203+i\%(203)$$

The symbol "%" is used to indicate the remainder of a division (e.g., the modulus function) and the symbol "/" is used to indicate integer division.

The value "pos" is the position of i-th byte in the n-th section of the memory 112, i=0, 1, 2, ..., 77951, and n=0, 1, 2, ..., 47. In the example of the Japanese ISDB standard, "frame" may have a value from 0 to 7, "slot" may have a value from 0 to 47, "index" may have a value from 0 to 202, and "pos" may have a value from 0 to 1623.

The data bytes are generally received by the circuit 100 at a constant rate. In order to use only one super frame of memory, the reading of data may start before the write pointer 108 has reached the end of one super frame.

The following example may illustrate writing data into the memory 112:

For i-th data byte received by the circuit 100:

$$\text{frame}=i/(N{\times}L)=i/(203{\times}48)=i/9744$$

$$\text{slot}=i\%(N{\times}L)/N=i\%(203{\times}48)/203=i\%9744/203$$

$$\text{index}=i\%(N{\times}L)\%N=i\%(203{\times}48)\%203=i\%9744\%203=i\%203$$

$$\text{pos}=\text{frame}{\times}N+\text{index}=\text{frame}{\times}203+\text{index}=(i/9744){\times}203+i\%203$$

where "pos" is the position of the i-th byte in the n-th 203×8 section of the memory 112. i=0, 1, 2, ..., 77951 and n=0, 1, 2, ..., 47. So frame=0, 1, ..., 7. slot=0, 1, 2, ..., 47. index=0, 1, 2, ..., 202. pos=0, 1, 2, ..., 1623. Also n=slot.

For the i-th data byte read from the memory 112 for presentation by the circuit 100, "in" may be the receiving order and "out" may be the presentation order:

$$\text{in}=i$$

$$\text{out}=\text{pos}\%I{\times}(N{\times}L)+\text{pos}/I+\text{slot}{\times}N=\text{pos}\%8{\times}9744+\text{pos}/8+\text{slot}{\times}203$$

(Note: pos%8×9744=(remainder of pos/8) multiplied by 9744.

The amount of delay between receiving a particular byte of data and presenting the particular byte of data may be defined as:

$$\text{delay}=\text{out}-\text{in}=\text{pos}\%I{\times}(N{\times}L)+\text{pos}/I+\text{slot}{\times}N-i=(\text{frame}{\times}N+\text{index})\%I{\times}(N{\times}L)+(\text{frame}{\times}N+\text{index})/I+\text{slot}{\times}N-i$$

For example, when i=0:

frame=0 slot=0 index=0

$$\text{delay}=\text{out}-\text{in}=(\text{frame}{\times}N+\text{index})\%I{\times}(N{\times}L)+(\text{frame}{\times}N+\text{index})/I+\text{slot}{\times}N-i=(0{\times}203+0)\%8{\times}(203{\times}48)+(0{\times}203+0)/8+0{\times}N-0=0$$

Also for example when i=77951 frame=7 slot=47 index=202

$$\text{delay}=\text{out}-\text{in}=(\text{frame}{\times}N+\text{index})\%I{\times}(N{\times}L)+(\text{frame}{\times}N+\text{index})/I+\text{slot}{\times}N-i=(7{\times}203+202)\%8{\times}(203{\times}48)+(7{\times}203+202)/8+47{\times}203-77951=7{\times}203{\times}48+202+47{\times}203-77951=0.$$

For the data between 0 (e.g., a first byte) and 77951 (e.g., a last byte), the delay may either be positive or negative. A positive delay may exist when, at the time for the i-th data byte to be output to the next stage, the data byte is already in the memory 112. A negative delay may exist when, at the time for the i-th data byte to be output to the next stage, the data byte is not in the memory 112. A negative delay may indicate that the circuit 100 will generally have to wait until a data byte is received. Since an ISDB system is generally designed to run at a constant data rate, all of the data bytes should generally be sent to the next stage at a constant rate. Therefore, the circuit 100 generally cannot pause, since holes are not allowed. To avoid a negative delay, the read pointer 110 should be delayed to make sure that a particular data byte is in the memory 112 before the time to send the particular data byte to the next stage.

If δ is the delay between the read pointer and the write pointer, then the delay between receipt and presentation of a particular data byte may be:

$$\text{delay}=\text{out}-\text{in}+\delta.$$

The δ should generally be set to a value that will make the delay positive. The minimum limitation may be expressed as the minimum δ required to make sure the delay is greater than 0:

$$\delta \geq N{\times}L{\times}I-N{\times}L-7=77952-9744-7=68201.$$

If the circuit 100 is designed to use only one super frame memory for continuous operation, the memory 112 generally will not hold more than one super frame of data bytes. Therefore, the maximum limitation may be expressed, in one example, as:

$$\delta \leq N{\times}L{\times}I=77952$$

For any one super frame memory architecture de-interleaver used in an ISDB decoder, the constraint may be expressed as:

$$N \times L \times I - N \times L - 7 \leq \delta \leq N \times L \times I$$

The above constraint may called the operation window for a one super frame memory de-interleaver. The operation window may be used, in one example, as a dynamic FIFO to interface the circuit 100 with a TCM decoder and an RS decoder.

In one example, N=11 may be selected to explain the operation of the circuit 100. The reason for selecting N=11 is that 11%8=3 (e.g., the remainder when 11 is divided by 8 is 3) provides the same result as 203%8=3. The circuit 100 may comprise, in one example, 48 small block de-interleavers (e.g., one for each slot of a Japanese ISDB standard super frame). The operation may be the same for all 48 only one slot will be described in detail. Any operation performed by one de-interleaver memory will be repeated for each slot (e.g., the operations will be repeated in each of the 48 memory segments) before a next operation is started. The operations include reading or writing one slot of data (e.g., 11 bytes in the example, or 203 bytes in ISDB).

Figure 4:
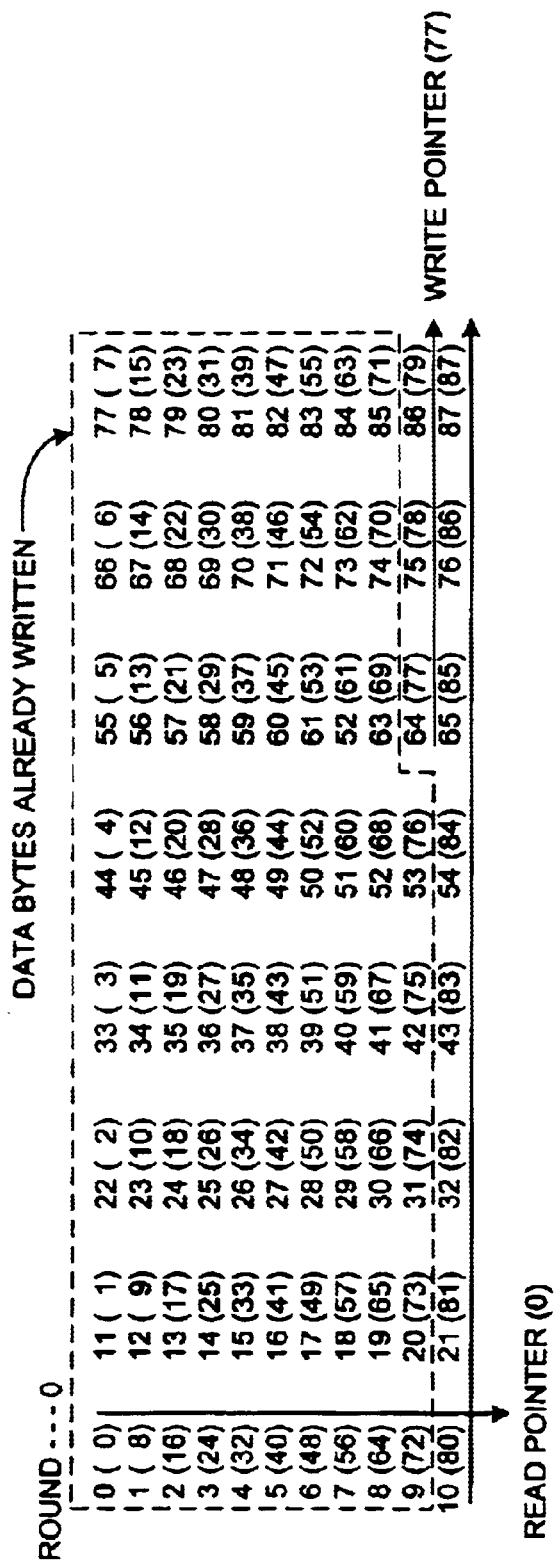
FIG. 4 is a diagram illustrating a delay between a read pointer and a write pointer of FIG. 2.

Referring to FIGS. 3–5, examples of memory dumps illustrating the contents of one of the segments of the memory 112 at various times are shown. The data before being interleaved may be a simple ramp from 0 to 87. For one block (e.g., 11×8=88 bytes), the data bytes received by the block would generally be 0, 11, 22, 33, 44, 55, 66, 77, 1, 12, . . . . The format of the memory dump is generally "information(address)". During the first round write operation (e.g., FIG. 3), the write pointer 108 generally increments from memory address 0 to 87. The read pointer 110 generally follows the pattern 0, 8, 16, 24, 32, 40, 48, 56, 64, 72, 80, 1, 9, 17, . . . . The address accessed by the write pointer 108 (e.g., WADDR) may be expressed, in one example, as "WADDR=WINDEX" (e.g., the write index). The address accessed by the read pointer 110 (e.g., RADDR) may be expressed, in one example, as "RADDR RFRAME+RINDEX×8."

The values WINDEX and RINDEX may serve as the respective indices for the write pointer 108 and the read pointer 110. The values WINDEX and RINDEX may be different for the same incoming byte number. The values WINDEX and RINDEX are generally the sequence numbers for writing and reading operations, respectively. The value RFRAME may be the number of the output frame of the data. For example, the information byte "11" is generally received second for the write operation (e.g., WINDEX=1) and is generally read $12^{th}$ (e.g., RINDEX=11). When WADDR and RADDR are the same, the write operation and the read operation are generally performed on the same memory location.

According to the operation window discussed above, the read operation in a given segment of the memory 112 will generally not start until the write operation in the same segment has started the last slot of data. Otherwise, the read pointer 110 may overtake the write pointer 108. After the write pointer 108 has gone through all the shaded area, the read pointer 110 will start the beginning (e.g., FIG. 4). When the write pointer 108 has finished writing address 87 (e.g., 1691 for ISDB), the read pointer 110 will generally have finished reading out the data bytes of the first slot. The write pointer 108 and the read pointer 110 will generally not stop or wait for each other. The read pointer 110 will generally continue down the second column. The write pointer 108 will generally change direction and begin moving down the columns starting with the first column. The write pointer 108 will generally only use the space not occupied by unread data bytes (e.g., FIG. 5). The first column is generally the only slot of 11 bytes that is empty (e.g., the data has already been read). The next 11 bytes of data received by the circuit 100 will generally be written into the 11 bytes of the first column.

Referring to FIG. 6, memory dumps of a representative segment of the memory 112 illustrating the location of written information after rounds 1–5 are shown. The read and write address calculations of a current round are generally different from a previous round. As the read and write operations are performed, the address calculations will generally become more and more complicated. The read and write address calculations should generally be done separately due to the delay between the read pointer 110 and the write pointer 108 and the different values of frame, slot and index.

The write pointer 108 generally follows the read pointer 110 at the same slot or one slot later. The sequence of addresses to be used by the write pointer 108 may be, in one example, copied from the previous address mapping of the read pointer 110. If the write address mapping is considered over an 8×11 RAM, then the read address mapping will generally be considered over an 11×8 RAM. Comparing the round 0 address mapping to the round 1 address mapping generally illustrates that the RAM is treated as having been converted from 11×8 to 8×11. A similar result may be found by comparing the round 2 mapping to the round 1 mapping. The read address calculations may convert the 11×8 read address mapping to 8×11 and may then use the 11×8 for the next round of reading.

If "i" is the sequence number of a byte in a super frame, N is 11 or 203 for ISDB, L is 48, and I is 8, then, for one example:

$$frame = i/(N \times L)$$

$$slot = i\%(N \times L)/N$$

$$index = i\%(N \times L)\%N$$

$$pos = frame + (index \times I)$$

$$raddr[pos] = raddr[pos]\%N \times I + raddr[pos]/N$$

The value "pos" is generally the sequence number of the byte i in one of the segments of the memory 112. The above reading address formula incorporates the I×N conversion.

Such a method will generally use one extra N×I piece of memory to remember the reading addresses. After each reading the address is generally updated to the address for the next round of reading. Since the writing address is copied from the previous reading address, one extra N memory is generally needed.

The total memory generally needed for chip implementation of the embodiment described above may be:

$$N \times I \times L \times 8 + (N \times I + N) \times \log_2(N \times I)$$

For an ISDB application where N=203, I=8, L=48, and the address memory is 11 bits, the total memory needed may be:

$$203 \times 8 \times 48 \times 8 + (203 \times 8 + 203) \times \log_2(203 \times 8) = 643,713(bits)$$

In general, the read address iteration will eventually repeat to the initial state. For an 11×8 block de-interleaver, the read address will generally return to the first round patterns after 28 iterations. For a 203×8 ISDB block de-interleaver, the iteration number is generally 180.

For a chip implementation, the read address mapping calculation should generally start with a valid read address mapping, to avoid generating the wrong results and not returning to the first state. Since there is generally a delay between the read pointer 110 and write pointer 108, the read address for the memory should generally be initialized so as to take into account the different start positions.

Figure 7:
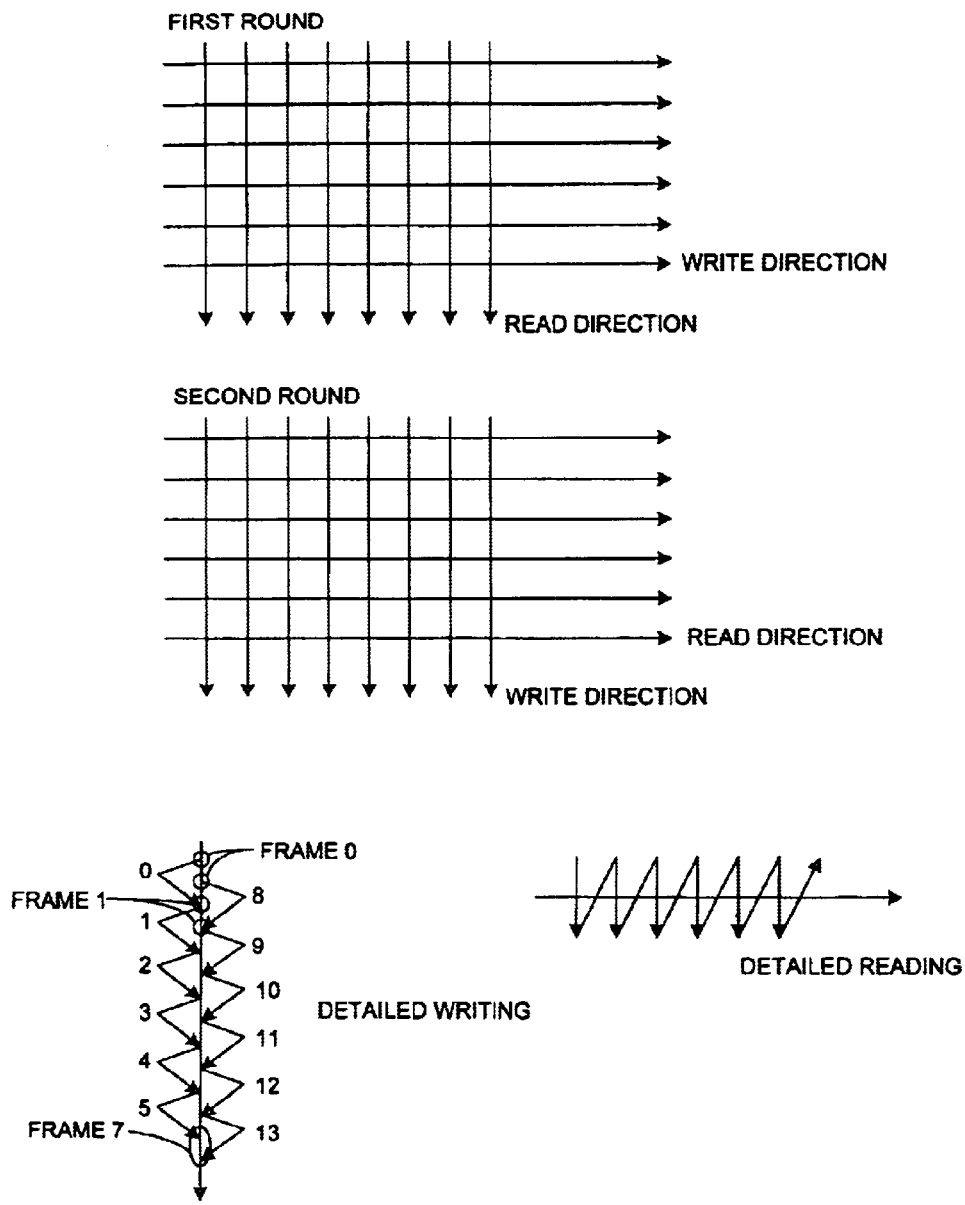
FIG. 7 is a diagram illustrating a second round read and write operation.

Referring to FIG. 7, a diagram illustrating an alternative method of writing and reading data to the memory 112 is shown. The alternative method generally comprises a first and a second round. In the first round, data is generally written by rows and read by columns. During the second round, the writing and reading directions are exchanged and writing and reading are generally not to and from sequential addresses, respectively.

During the second round of writing, the write pointer 108 may be configured to increment the write address to M, where M%I=0 (e.g., 16 for the current example or 208 for ISDB), for each data byte written. When the write pointer 108 reaches the end of a column or would jump out of range, the write pointer 108 generally returns to a first available space in the same column. The write pointer 108 generally continues in this manner until the column is filled. After a column is full, the write pointer 108 generally moves to the next column and repeats the steps.

Figure 8:
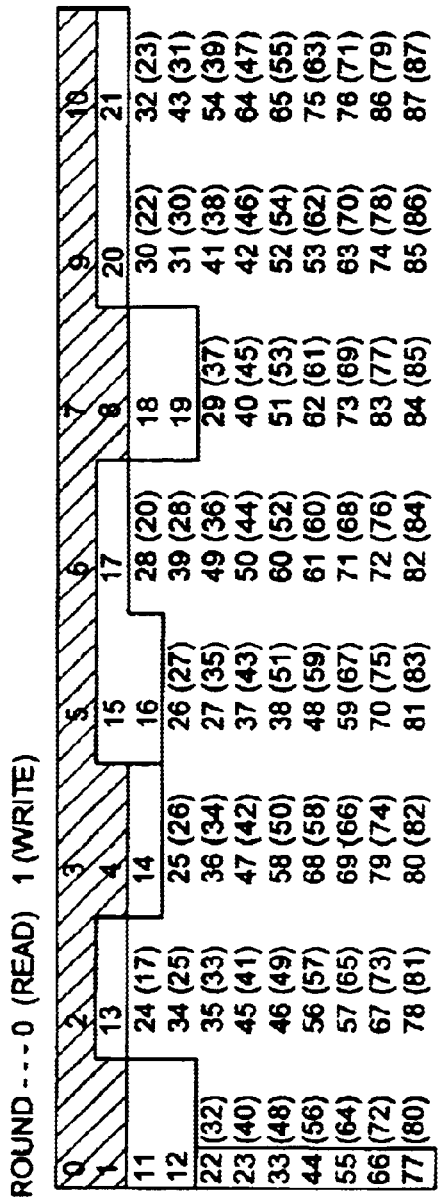
FIG. 8 is a diagram illustrating data of the second super frame received grouped according to output frame.

Referring to FIG. 8, a diagram illustrating the contents of a segment of the memory 112 after a second round write operation is shown. The data bytes are shown grouped by output frames. The non-continuous pattern may make calculating read addresses complex.

Referring to FIG. 9, a diagram illustrates the addition of memory to each segment of the memory 112. In general, enough memory is added to each slot segment so that the memory for storing a slot is evenly divisible by the number of frames (e.g., a 203×8 segment would be expanded to 208×8).

Referring to FIG. 10, a diagram illustrating the result of the added memory on the organization of data bytes is shown. The data bytes of each output frame are generally stored in contiguous locations and read address calculations are generally simplified.

In the first round of writing and reading, the addressing of the memory 112 is generally similar to the addressing described in connection with round one of FIG. 3. The additional memory space is generally left unused. In the second round of writing, the additional memory is generally used to facilitate grouping the data bytes by frame (e.g., as shown in FIG. 7).

During the second round of reading, the read pointer 110 may be configured to address M/I values from each column. The read pointer is generally moved back to the first column and the control circuit 106 generally reads the next M/I rows of data. The control circuit 106 repeats the process until all of the data has been read. The control circuit 106 will generally cycle through the first and second rounds as long as data is received.

If "i" is the sequence number for a particular data byte in one super frame of data bytes, N is 11 or 203 for ISDB, L is 48, I is 8, and M is the number of bytes in an expanded column (e.g., 16 in the present example, or 208 for ISDB), the sequence of addresses generated by the control circuit 106 may be calculated according to the following criteria:

$$M=(N+I-1)/I \times I.$$

The sequence of addresses used to control writing to the memory 112 during the first and second rounds may be described by the following criteria:

$$frame=i/(N \times L)$$

$$slot=i\%(N \times L)/N$$

$$index=i\%(N \times L)\%N$$

$$write\_pos=(frame \times N)+index$$

for the first round of writing, $$write\_address(i)=write\_pos/I+write\_pos\%I \times M;$$

for the second round of writing, $$write\_address(i)=write\_pos\%M/I+write\_pos\%I \times M/I+write\_pos/M \times M.$$

The sequence of addresses used to control reading from the memory 112 during the first and second rounds may be described by the following criteria:

$$frame=i/(N \times L)$$

$$slot=i\%(N \times L)/N$$

$$index=i\%(N \times L)\%N$$

$$read\_pos=(frame \times M)+index$$

for the first round of reading, $$read\_address(i)=read\_pos$$

for the second round of reading, $$read\_address(i)=index\%(M/I)+index/(M/I) \times M+frame \times (M/I).$$

The total memory generally needed for de-interleaving a super frame of data in accord with the method described above may be determined by the following equation:

$$Memory\ Size(bits)=M \times I \times L \times 8.$$

For an ISDB application, N=203, I=8, L=48, and M according to the present invention will generally be 208. The total memory needed will generally be:

$$(208 \times 8 \times 48 \times 8)=638,976\ bits, or\ 78K\ bytes.$$

The amount of memory needed may be reduced further. The last 5 bytes of memory for each slot are generally not used in either the first round or the second round of writing and reading. Using the formula from above, the memory size may be reduced to:

$$(208 \times 8-5) \times 48 \times 8=637,056\ bits, or\ 77.766K\ bytes.$$

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory having a plurality of memory locations accessed by a plurality of addresses;
   a write pointer configured to write data to said memory in response to a sequence of write addresses generated in response to a first control signal;
   a read pointer configured to read data from said memory in response to a sequence of read addresses generated in response to a second control signal; and a control circuit configured to generate (i) said first control signal, and (ii) said second control signal, wherein the order said data is read from said memory comprises a de-interleaved pattern with respect to the order said data is written to said memory.

2. The apparatus according to claim 1, wherein said memory comprises slightly more memory than a super frame memory.

3. The apparatus according to claim 1, wherein said memory comprises 638,976 bits.

4. The apparatus according to claim 1, wherein said memory comprises 637,056 bits.

5. The apparatus according to claim 1, wherein said write pointer and said read pointer are separated by an operation window.

6. The apparatus according to claim 1, wherein said apparatus is used in a continuous operation environment.

7. The apparatus according to claim 1, wherein said apparatus comprises an integrated services digital broadcasting (ISDB) block de-interleaver.

8. The apparatus according to claim 1, wherein said apparatus comprises a Japanese integrated services digital broadcasting (ISDB) standard data transmissions block de-interleaver.

9. The apparatus according to claim 1, wherein said data comprises a super frame.

10. The apparatus according to claim 1, wherein said apparatus is configured to de-interleave a super frame, where said super frame comprises a number I of frames, each of said frames comprises a number L of slots, each of said slots comprises a number N of bytes, and I, L and N are integers.

11. The apparatus according to claim 10, wherein:
said memory comprises L sections; and
each of said L sections comprises an I×N array.

12. The apparatus according to claim 10, wherein:
said memory comprises L sections; and
each of said sections comprises an I×M array, where M is (i) an integer greater than N and (ii) evenly divisible by I.

13. An apparatus comprising:
means for storing data in a plurality of memory locations accessed by a plurality of addresses;
means for writing data to said memory locations in response to a sequence of write addresses generated in response to a first control signal;
means for reading data from said memory locations in response to a sequence of read addresses generated in response to a second control signal; and
means for generating (i) said first control signal, and (ii) said second control signal, wherein the order said data is read from said memory locations comprises a de-interleaved pattern with respect to the order said data is written to said memory locations.

14. A method for de-interleaving integrated services digital broadcast super frames comprising the steps of:
(A) writing data to a memory in response to a sequence of write addresses generated in response to a first control signal;
(B) reading data from said memory in response to a sequence of read addresses generated in response to a second control signal; and
(C) generating (i) said first control signal, and (ii) said second control signal, wherein the order data is read from said memory comprises a de-interleaved pattern with respect to the order said data is written to said memory.

15. The method according to claim 14, wherein said data comprises a plurality of super frames.

16. The method according to claim 15, wherein said super frames comprise Japanese integrated services digital broadcast (ISDB) standard super frames.

17. The method according to claim 10, wherein said first control signal is generated such that:
during a first round of writing, said sequence of write addresses is described by a first equation expressable as $$\text{write\_address}(i) = \text{write\_pos}/I + \text{write\_pos}\%I \times M; \text{ and}$$

during a second round of writing said sequence of write addresses is described by a second equation expressable as $$\text{write\_address}(i) = \text{write\_pos}\%M/I + \text{write\_pos}\%I \times M/I + \text{write\_pos}/M \times M, \text{ where}$$

$M = (N+I-1)/I \times I$,
frame$=i/(N \times L)$,
slot$=i\%(N \times L)/N$,
index$=i\%(N \times L)\%N$,
write_pos$=(\text{frame} \times N) + \text{index}$,
i is a sequence number of a data byte in one of said super frames, and
said super frames comprise a number I of frames, each of said frames comprises a number L of slots, each of said slots comprises a number N of bytes, and I, L and N are integers.

18. The method according to claim 14, wherein said second control signal is generated such that:
during a first round of reading, said sequence of read addresses is described by a first equation expressable as $$\text{read\_address}(i) = \text{read\_pos}; \text{ and}$$

during a second round of reading said sequence of read addresses is described by a second equation expressable as $$\text{read\_address}(i) = \text{index}\%(M/I) + \text{index}/(M/I) \times M + \text{frame} \times (M/I), \text{ where}$$

$M = (N+I-1)/I \times I$,
frame$=/(N \times L)$,
slot$=i\%(N \times L)/N$,
index$=i\%(N \times L)\%N$,
read_pos$=(\text{frame} \times M) + \text{index}$,
i is a sequence number of a data byte in one of said super frames, and
said super frames comprise a number I of frames, each of said frames comprises a number L of slots, each of said slots comprises a number N of bytes, and I, L and N are integers.

19. The method according to claim 14, wherein said first control signal and said second control signal are generated such that:
during a first round,
said sequence of write addresses is described by a first equation expressable as write_address(i)=write_pos/I+write_pos%I×M and
said sequence of read addresses is described by a second equation expressable as read_address(i)=read_pos; and
during a second round, said sequence of write addresses is described by a third equation expressable as write_address(i)=write_pos%M/I+write_pos%I×M/I+write_pos/M×M and said sequence of read addresses is described by a fourth equation expressable as read_address(i)=index%(M/I)+index/(M/I)×M+frame×(M/I), where

M=(N+I−1)/I×I, frame=i/(N×L), slot=i%(N×L)/N, index=i%(N×L)%N, write_pos=(frame×N)+index, read_pos=(frame×M)+index, i is a sequence number of a data byte in one of said super frames, and said super frames comprise a number I of frames, each of said frames comprises a number L of slots, each of said slots comprises a number N of bytes, I, L and N are integers, and said first and second rounds are repeated continuously.

20. The method according to claim 14, further comprising:

providing said memory comprising L sections, wherein each of said L sections comprises an I×M array, where M is (i) an integer greater than N and (ii) evenly divisible by I, I represents a number of frames in each of said super frame, L represents a number of slots in each of said frames, N represents a number of bytes in each of said slots, and I, L and N are integers.

* * * * *